United States Patent
Liu

(10) Patent No.: US 8,502,380 B2
(45) Date of Patent: Aug. 6, 2013

(54) CHIP PACKAGE AND FABRICATION METHOD THEREOF

(75) Inventor: Chien-Hung Liu, Taipei (TW)

(73) Assignee: Xintec Inc., Jhongli, Taoyuan County (TW)

( * ) Notice: Subject to any disclaimer, the term of this patent is extended or adjusted under 35 U.S.C. 154(b) by 60 days.

(21) Appl. No.: 12/899,258

(22) Filed: Oct. 6, 2010

(65) Prior Publication Data

US 2011/0079903 A1    Apr. 7, 2011

Related U.S. Application Data

(60) Provisional application No. 61/249,399, filed on Oct. 7, 2009.

(51) Int. Cl.
*H01L 23/48* (2006.01)

(52) U.S. Cl.
USPC ............ 257/738; 257/E21.599; 257/E23.068; 438/113

(58) Field of Classification Search
USPC ............ 257/738, E21.599, E23.068; 438/113
See application file for complete search history.

(56) References Cited

U.S. PATENT DOCUMENTS

| | | | | |
|---|---|---|---|---|
| 5,648,684 A * | 7/1997 | Bertin et al. | | 257/685 |
| 7,180,149 B2 * | 2/2007 | Yamamoto et al. | | 257/434 |
| 7,598,111 B2 * | 10/2009 | Im et al. | | 438/82 |
| 7,625,635 B2 * | 12/2009 | Kumazawa et al. | | 428/446 |
| 7,719,102 B2 * | 5/2010 | Noma et al. | | 257/697 |
| 7,829,438 B2 * | 11/2010 | Haba et al. | | 438/462 |
| 2004/0017012 A1 * | 1/2004 | Yamada et al. | | 257/774 |
| 2009/0309212 A1 * | 12/2009 | Shim et al. | | 257/700 |

* cited by examiner

*Primary Examiner* — John C Ingham
(74) *Attorney, Agent, or Firm* — Birch, Stewart, Kolasch & Birch, LLP

(57) ABSTRACT

A chip package and a fabrication method thereof are provided. The chip package includes a semiconductor substrate containing a semiconductor component and a conductive pad thereon. A through hole penetrates the semiconductor substrate from a backside thereof to expose the conductive pad. A redistribution layer is below the backside of the semiconductor substrate and electrically connected to the conductive pad in the through hole. A conductive trace layer is below the redistribution layer and extended along a sidewall of the semiconductor substrate to electrically contact with an edge of the redistribution layer.

24 Claims, 5 Drawing Sheets

CHIP PACKAGE AND FABRICATION METHOD THEREOF

CROSS REFERENCE TO RELATED APPLICATIONS

This application claims the benefit of U.S. Provisional Application No. 61/249,399, filed on Oct. 7, 2009, the entirety of which is incorporated by reference herein.

BACKGROUND OF THE INVENTION

1. Field of the Invention

The present invention relates to a chip package, and in particular relates to a chip package with a through hole and a redistribution layer and a fabrication method thereof.

2. Description of the Related Art

For conventional chip package technologies, chips are adhered to a print circuit board and then electrically connected to the print circuit board by a wire bonding method. Finally, the areas for wire bonding are covered with an encapsulant to form the conventional chip packages.

However, in the conventional chip packages, the encapsulant protrudes inward or outward at the wire bonding areas, such that the conventional chip packages have a concave and convex surface. When the conventional chip packages are applied to fingerprint readers, the concave and convex surface of the conventional chip packages reduces identification efficiency of fingerprints.

Therefore, a chip package design with a flat surface and a fabrication method thereof are thus desired.

BRIEF SUMMARY OF THE INVENTION

According to an illustrative embodiment, a chip package is provided. The chip package comprises a semiconductor substrate, having a first surface and an opposite second surface, wherein the semiconductor substrate contains a semiconductor component and a conductive pad disposed on the first surface. A through hole extends from the second surface of the semiconductor substrate to the conductive pad. A redistribution layer is disposed under the second surface of the semiconductor substrate and electrically connected to the conductive pad in the through hole, wherein an edge of the redistribution layer is exposed at a sidewall of the semiconductor substrate. Then, a conductive trace layer is disposed below the redistribution layer, extending to the sidewall of the semiconductor substrate to electrically contact with the redistribution layer.

According to another illustrative embodiment, a method for fabricating a chip package is provided. The method comprises providing a semiconductor wafer, having a first surface and an opposite second surface, wherein the semiconductor wafer contains a plurality of semiconductor components and a plurality of conductive pads disposed on the first surface. A plurality of through holes is formed, extending from the second surface of the semiconductor wafer to the conductive pads. A redistribution layer is formed under the second surface of the semiconductor wafer, electrically connecting to the conductive pads in the through holes, and an edge of the redistribution layer is exposed at a sidewall of the semiconductor wafer. Then, a conductive trace layer is formed below the redistribution layer, extending to the sidewall of the semiconductor wafer to electrically contact with the redistribution layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
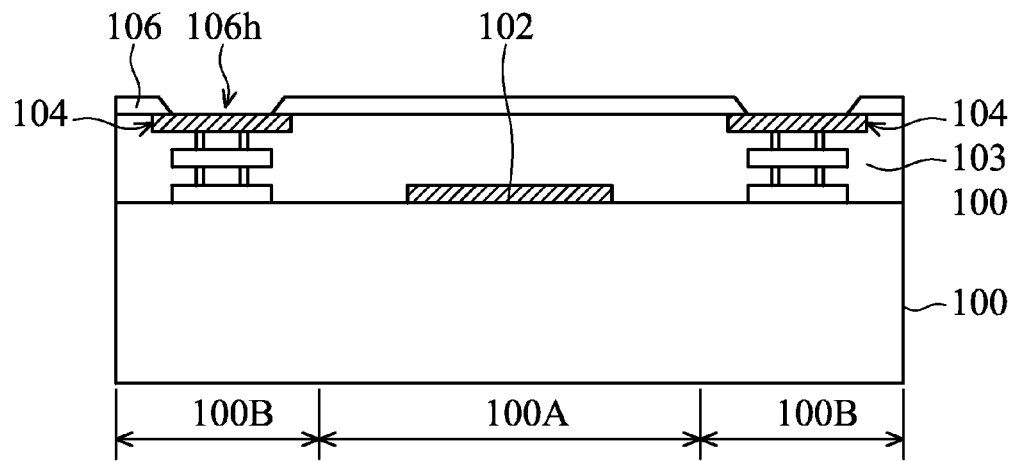
FIGS. 1A-1J are illustrative cross sections showing the steps for fabricating a chip package according to an embodiment of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts. In the drawings, the size of some of the elements may be exaggerated and not drawn to scale for illustrative purposes. The dimensions and the relative dimensions do not correspond to actual dimensions to practice of the invention. Further, parts of the elements in the drawings may be illustrated by the following description. Some elements not shown in the drawings are known by one skilled the art.

The embodiments of chip packages of the invention and fabrication methods thereof are illustrated by embodiments of fabricating image sensor chip packages, such as those used for fingerprint readers, in the following description. However, it should be appreciated that the invention may also be applied to forming other semiconductor chips. Therefore, the packages of the embodiments of the invention may be applied to active or passive devices, or electronic components with digital or analog circuits, such as optoelectronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, solar cells, RF circuits, accelerators, gyroscopes, micro actuators, surface acoustic wave devices, pressure sensors, and ink printer heads.

The wafer level packaging process herein mainly means that after the packaging process is accomplished during a wafer stage, a wafer with chips is cut to obtain separate independent packages. However, in an embodiment of the invention, separate independent chips may be redistributed overlying a supporting wafer and then be packaged, which may also be referred to as a wafer level packaging process. In addition, the wafer level packaging process may also be adapted to form chip packages of multi-layered integrated circuit devices by stacking a plurality of wafers having integrated circuits together.

An embodiment of the invention provides a chip package and a fabrication method thereof, using process technologies of forming a through hole and a T-shaped contact to make the chip packages with a flat sensor surface.

Referring to FIGS. 1A-1J, cross sections illustrating the steps for fabricating a chip package according to an embodiment of the invention are shown. As shown in FIG. 1A, first, a semiconductor substrate 100, generally a semiconductor wafer such as a silicon wafer or a silicon substrate is provided. Moreover, there is a plurality of device areas 100A defined on the semiconductor substrate and each device area 100A is surrounded by a peripheral bonding pad area 100B. The device area 100A and the peripheral bonding pad area 100B are combined to form a portion of a die area.

Next, a semiconductor device 102 is formed on the device area 100A, for example a fingerprint reader, an image sensor device or other micro electro mechanical structures. An intermetal dielectric (BID) layer 103 is formed to cover the semiconductor substrate 100 and the semiconductor device 102. The intermetal dielectric layer 103 can be selected from low dielectric constant (low k) insulating materials, such as porous oxides. Then, a plurality of conductive pad structures 104 is formed in the intermetal dielectric layer 103 at the peripheral bonding pad area 100B. In this embodiment, the conductive pad structure 104 includes a plurality of metal layers, which are preferably formed from copper (Cu), aluminum (Al) or other suitable metal materials.

Moreover, the semiconductor substrate 100 may be covered with a chip passivation layer 106. The chip passivation layer 106 is defined to form a plurality of openings 106h in advance to expose the conductive pad structures.

Figure 1B:
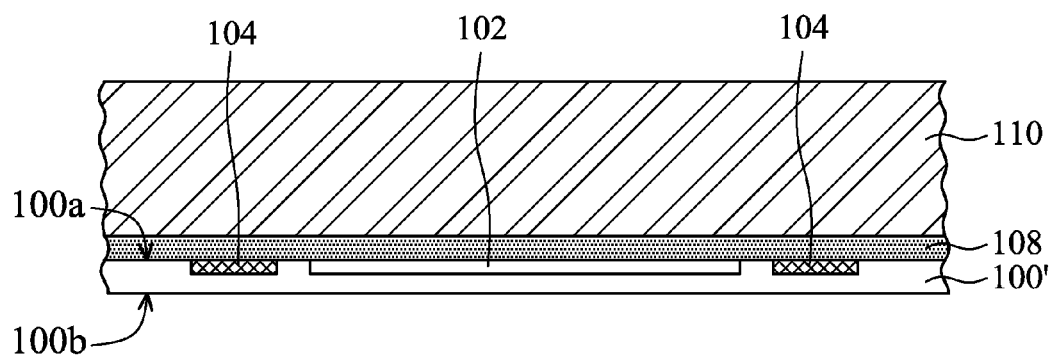

Then, referring to FIG. 1B, a carrier layer 110, for example a semiconductor substrate or a glass substrate is provided. The semiconductor substrate for the carrier layer may be another blank silicon wafer. The carrier layer 110 is bonded to a first surface 100a of the semiconductor wafer 100 by an adhesive layer 108. The adhesive layer 108 may be an adhesive agent containing epoxy resin. In order to simply illustrate the embodiments, the semiconductor substrate 100 in the drawings only shows the semiconductor device 102 and the conductive pad structures 104. Next, the semiconductor wafer 100 is thinned by a chemical mechanical polishing (CMP) process, an etching process, a milling process, a grinding process or a polishing process. In one embodiment, a thinned semiconductor wafer 100' has a thickness of about 30 µm to about 50 µm.

Figure 1C:
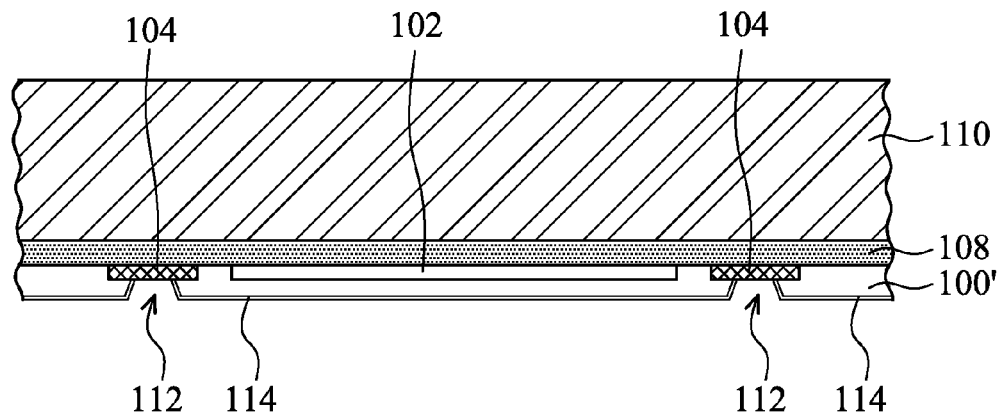

Referring to FIG. 1C, a plurality of through holes 112 is formed on a second surface 100b of the thinned semiconductor wafer 100' by a photolithography and etching process to expose the conductive pad structures 104. Next, an insulating layer 114 is formed on the second surface 100b of the thinned semiconductor wafer 100' by a coating method and the insulating layer 114 extends onto the sidewalls of the through holes 112. The material of the insulating layer 114 may be oxides or photosensitive insulating materials, such as photoresist materials containing epoxy resin. The insulating layer 114 formed on the bottom of the through holes 112 can be removed by a development process.

In an embodiment, the thickness of the insulating layer 114 may be between about 5 µm and about 15 µm, wherein 10 µm is preferred.

Figure 1D:
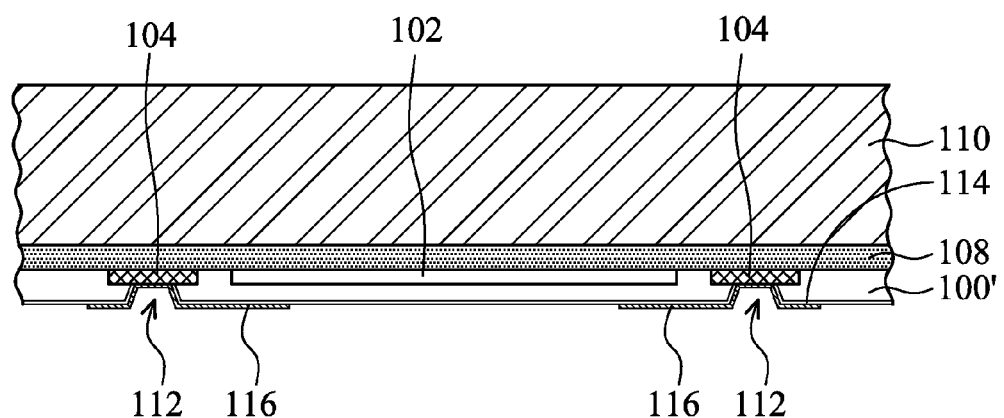

Next, a step of forming a redistribution layer is performed. Referring to FIG. 1D, a conductive layer 116 is conformally formed on the insulating layer 114 and extends to the sidewalls and the bottom of the through holes 112 to be in contact with the conductive pad structures 104 for forming electrical connection between the conductive layer 116 and the conductive pad structures 104. Because the conductive layer 116 can redistribute the conductive trace for signal transmitting of the chip package, the conductive layer 116 is also referred to a redistribution layer. First, a conductive material layer (not shown), made of material such as copper (Cu), aluminum (Al), or nickel (Ni), is deposited on the insulating layer 114 and in the through holes 112 by a sputtering method, an evaporation method or an electroplating method. Then, the conductive material layer is patterned by a photolithography and etching process to form the conductive layer 116.

Figure 1E:
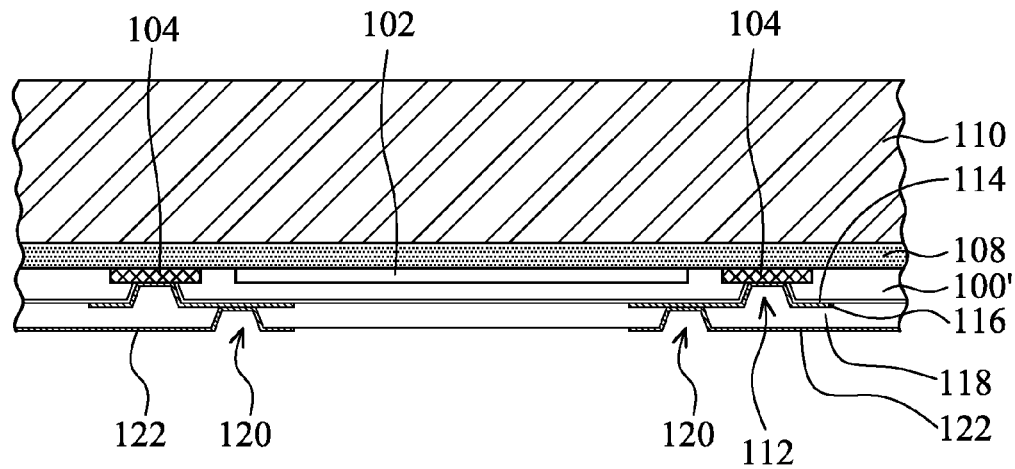

Referring to FIG. 1E, an insulating layer 118 is formed on the second surface 100b of the thinned semiconductor wafer 100' to cover the conductive layer 116 and the insulating layer 114. The material of the insulating layer 118 may be oxides or photosensitive insulating materials, such as photoresist materials containing epoxy resin. In an embodiment, the thickness of the insulating layer 118 may be between about 20 µm and about 30 µm, wherein 25 µm is preferred. Moreover, in an embodiment, the material of the insulating layer 118 may be the same as that of the insulating layer 114.

Next, a plurality of openings 120 is formed in the insulating layer 118 by an exposure and development process to expose parts of the conductive layer 116. Then, a redistribution layer 122 is conformally formed on the insulating layer 118 and extended to the sidewalls and the bottoms of the openings 120 to be in contact with the conductive layer 116 for forming electrical connection between the conductive layer 116 and the redistribution layer 122. First, a conductive material layer (not shown), made of material such as copper (Cu), aluminum (Al), or nickel (Ni), is deposited on the insulating layer 118 and in the openings 120 by a sputtering method, an evaporation method or an electroplating method. Then, the conductive material layer is patterned by a photolithography and etching process to form the redistribution layer 122. It is noted that, in a subsequent step, a notch channel 130 is formed on the edge of the die area. Thus, the redistribution layer 116 contracts toward the inner of the chip package for disposition apart from the notch channel 130 with a distance. Then, the redistribution layer 122 is extended to, at least, a premeditated area of the notch channel 130 or to the outer edge of the die area for forming a contact area with a subsequently formed conductive trace layer 132.

Figure 1F:
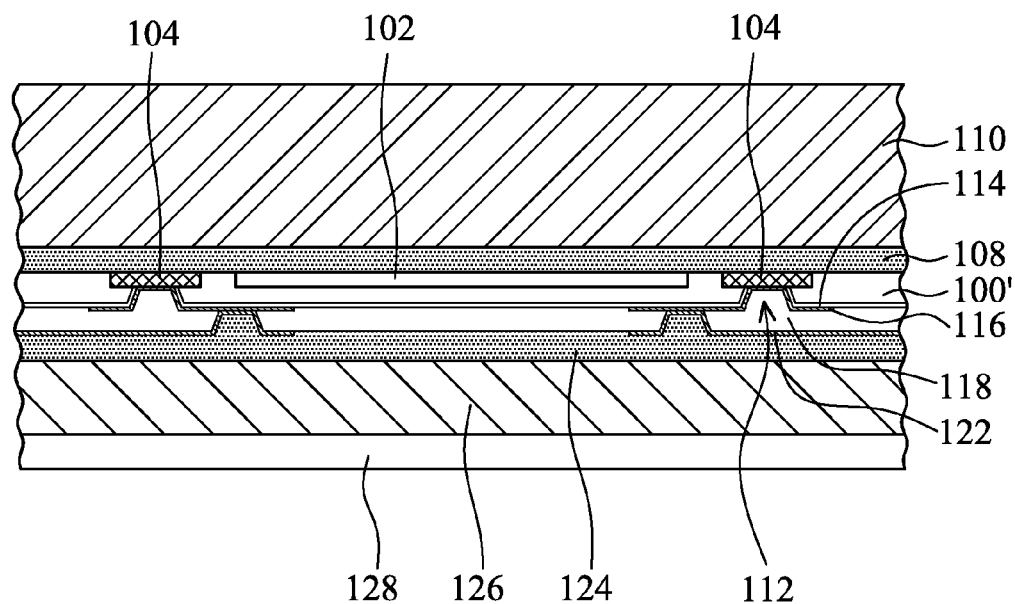

Referring to FIG. 1F, a packaging layer 126 is provided. The packaging layer 126 may be a semiconductor substrate or a glass substrate, which is bonded on the redistribution layer 122 and the insulating layer 118 through an adhesive layer 124. The adhesive layer 124 may be an adhesive agent containing epoxy resin. The packaging layer 126 can support the thinned semiconductor wafer 100' to enhance the mechanical strength of the chip packages. Then, an insulating layer 128 is formed on the packaging layer 126. The insulating layer 128 may be formed from epoxy resin or solder mask materials, which can be used for a stress release layer.

Figure 1G:
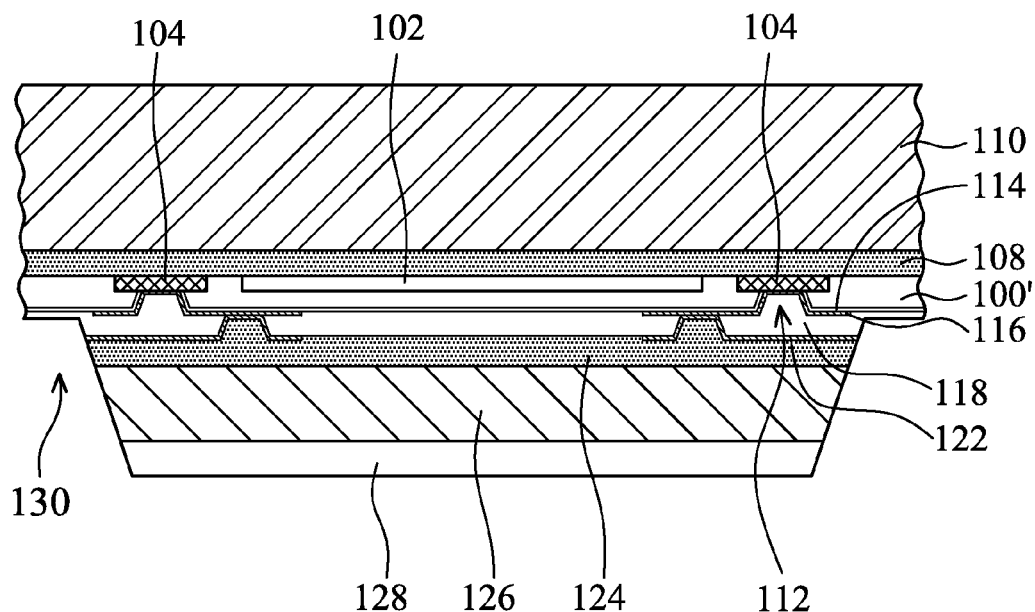

Referring to FIG. 1G, a notching process is performed to the insulating layer 128 on the second surface 100b of the thinned semiconductor wafer 100', the packaging layer 126, the adhesive layer 124, the redistribution layer 122 and the insulating layer 118 to form the notch channel 130. The notch channel 130 extends from the insulating layer 128 to the insulating layer 118, but does not pass through the insulating layer 118. The edge of the redistribution layer 122 is exposed by the notch channel 130, wherein the insulating layer 118 is used as a buffer so that a scriber does not cut to the silicon substrate 100'.

Figure 1H:
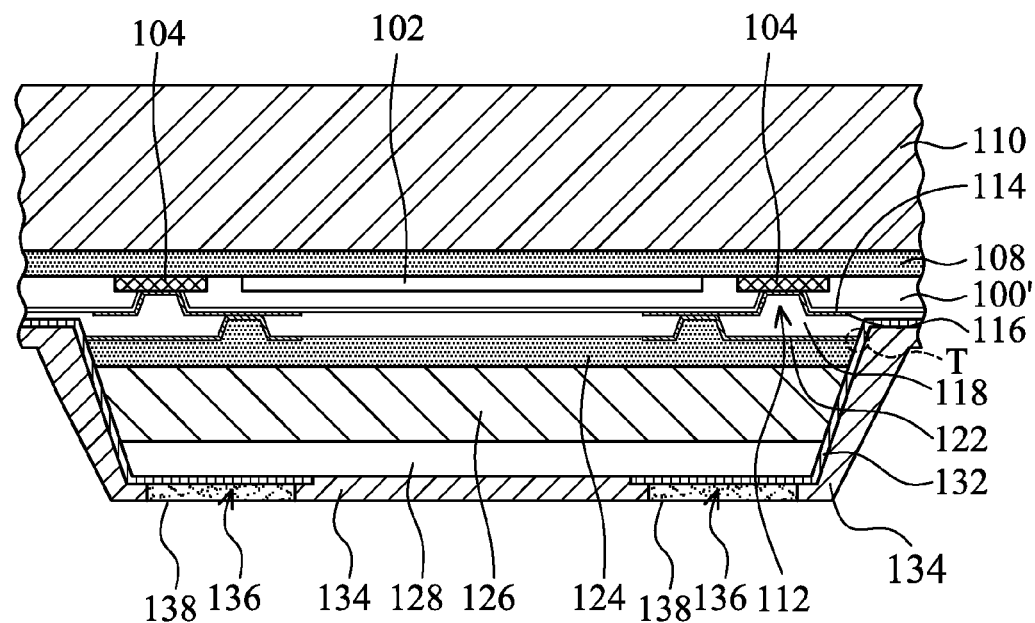

Next, referring to FIG. 1H, the conductive trace layer 132 is formed on the insulating layer 128 and extends to the sidewall and the bottom of the notch channel 130 to electrically contact with the redistribution layer 122. For example, the conductive trace layer 132 and the redistribution layer 122 form a T-shaped contact T. First, a conductive material layer (not shown), made of material such as copper (Cu), aluminum (Al), or nickel (Ni), is deposited on the insulating layer 128 and in the notch channel 130 by a sputtering method, an evaporation method or an electroplating method. Then, the conductive material layer is patterned by a photolithography and etching process to form the conductive trace layer 132. Next, a passivation layer 134, for example a solder mask is coated on the insulating layer 128 and the conductive trace layer 132 to cover the conductive trace layer 132. Then, the passivation layer 134 is patterned to form openings 136, exposing parts of the conductive trace layer 132. A solder material is dispersed in the openings 136 of the passivation layer 134 and then a reflow process is performed to form conductive bumps 138. The conductive bumps 138 can be a ball grid array (BGA) or a land grid array (LGA).

Figure 1I:
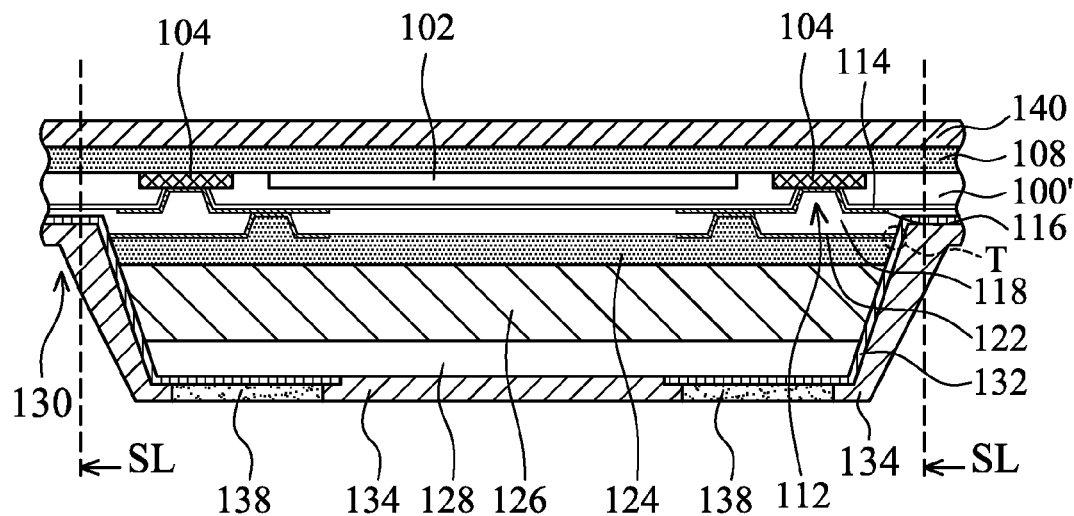

Referring to FIG. 1I, in an embodiment, the temporary carrier layer 110 can be removed by a chemical mechanical polishing (CMP) process, an etching process, a milling process, a grinding process or a polishing process. In an embodiment, the temporary carrier layer 110 can be removed by a stripping method. Then, in an optional step, a passivation layer 140 is formed on the adhesive layer 108. The passivation layer 140 can be formed from harder solder mask materials with hardness greater than about 7, such that the passivation layer 140 has scratch-proof and wear-resisting effects.

Figure 1J:
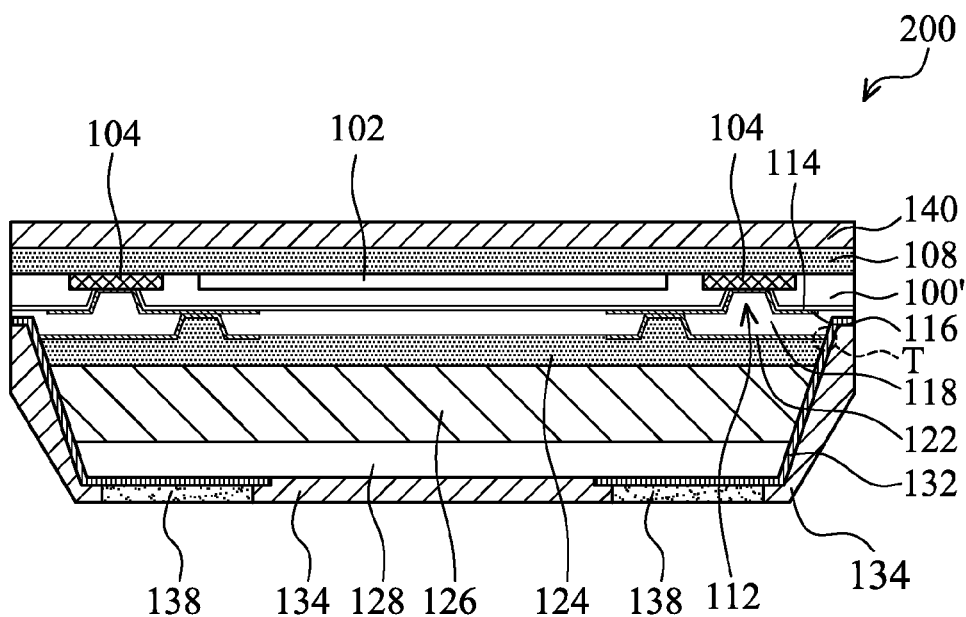

Then, the semiconductor wafer 100' is diced along a scribe line SL to form a plurality of chip packages 200 as shown in FIG. 1J.

Referring to FIG. 1J, a cross section of a chip package according to an embodiment of the invention is shown. The wafer is divided along the scribe line SL to form the chip packages 200. The semiconductor substrate 100' of the chip packages 200, for example, is formed from dicing the thinned semiconductor wafer containing the die area. In the die area, the device area 100A of the semiconductor substrate 100' has the semiconductor device 102 thereon and the plurality of conductive pad structures 104 at the peripheral bonding pad area 100B is disposed surrounding the device area 100A. The conductive pad structures 104 may be bonding pads, which can be electrically connected to the semiconductor device 102 through metal interconnections (not shown).

In an embodiment, the chip packages 200 can be applied in, but is not limited to, the manufacturing of fingerprint readers or sensor devices, such as complementary metal oxide semiconductor (CMOS) devices or charge-couple devices (CCD). Moreover, the chip packages 200 can also be applied in the manufacturing of micro electro mechanical system (MEMS) devices.

In an embodiment, the redistribution layers 116 and 122 and the conductive trace layer 132 can be formed by firstly depositing a conductive material layer (not shown), made of materials such as copper (Cu), aluminum (Al), or nickel (Ni), by a sputtering method, an evaporation method or an electroplating method, and then the conductive material layer is patterned by a photolithography and etching process to make the redistribution layers of 116 and 122 and the conductive trace layer 132 electrically connected to the conductive pad structures 104.

According to an embodiment of the invention, in the chip package, by using the through holes 112, the redistribution layers 116 and 122, and the conductive trace layer 132, which are in electrical contact with the edge of the redistribution layer 122, electrical connection to the conductive pad structures 104 of the chip is achieved and a chip package with a flat packaging surface is formed. When the embodiments of the chip packages of the invention are applied in the manufacturing of fingerprint readers, efficiency of fingerprint identification is enhanced.

Note that the insulating layer thickness required for forming the T-shaped contact can be increased through the redistribution layers and the insulating layers so that the conductive trace layer 132 of the T-shaped contact is not close to the semiconductor substrate 100'.

Moreover, in the embodiments of the chip packages of the invention, the through holes are formed in the thinned semiconductor wafer. Because the depth of the through hole is reduced by the thinned semiconductor wafer, the diameter of the through hole is also reduced. Accordingly, the embodiments of the chip packages of the invention can be applied to chips with a smaller pitch between the conductive pads. In an embodiment, the pitch between the conductive pads of a chip may be smaller than 100 μm.

In addition, in the embodiments of the chip packages of the invention, the packaging layer 126 can support the thinned semiconductor wafer 100' and enhance the mechanical strength of the chip package 200. Also, the insulating layer 128 disposed on the packaging layer 126 can be used for a stress release layer. When external force is placed upon the chip package, the insulating layer 128 can prevent the chip package from damage. Moreover, the passivation layer 140 disposed on the outside of the chip package can provide scratch-proof and wear-resisting effects to prevent the chip package from damage.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a semiconductor substrate, having a first surface and an opposite second surface, containing a semiconductor component and a conductive pad disposed on the first surface;
   a through hole extending from the second surface of the semiconductor substrate to the conductive pad;
   a first insulating layer disposed under the second surface of the semiconductor substrate and having an opening;
   a redistribution layer disposed under the second surface of the semiconductor substrate, electrically connecting to the conductive pad in the through hole, wherein the redistribution layer is conformally formed under the first insulating layer and conformally formed in the opening of the first insulating layer and an edge of the redistribution layer is exposed at a sidewall of the semiconductor substrate; and
   a conductive trace layer disposed below the redistribution layer, extending to the sidewall of the semiconductor substrate to electrically contact with the redistribution layer.

2. The chip package as claimed in claim 1, wherein the redistribution layer is a stack layer and comprises:
   a first redistribution layer disposed in the through hole for electrically connecting to the conductive pad and extending to under the second surface of the semiconductor substrate; and
   a second redistribution layer disposed below the first redistribution layer and electrically connecting to the first redistribution layer.

3. The chip package as claimed in claim 2, further comprising:
   a second insulating layer disposed between the semiconductor substrate and the first redistribution layer, wherein the first insulating layer is disposed between the first redistribution layer and the second redistribution layer.

4. The chip package as claimed in claim 3, wherein the first redistribution layer is exposed through the opening of the first insulating layer, and the second redistribution layer is formed in the opening to electrically connect to the first redistribution layer and extend onto the first insulating layer.

5. The chip device package as claimed in claim 3, wherein the material of the first insulating layer comprises a photosensitive insulating material.

6. The chip device package as claimed in claim 3, wherein the sidewall of the semiconductor substrate has a notch channel and a bottom of the notch channel extends to the first insulating layer.

7. The chip package as claimed in claim 6, wherein the conductive trace layer extends from a sidewall of the notch channel to the first insulating layer.

8. The chip package as claimed in claim 7, wherein the first insulating layer is disposed apart from the notch channel by a distance and the first insulating layer extends to the sidewall of the notch channel for electrically connecting to the conductive trace layer.

9. The chip package as claimed in claim 1, further comprising a packaging layer disposed under the second surface of the semiconductor substrate and between the redistribution layer and the conductive trace layer.

10. The chip device package as claimed in claim 9, wherein the packaging layer comprises a semiconductor substrate or a glass substrate.

11. The chip device package as claimed in claim 9, further comprising;
an adhesive layer disposed between the redistribution layer and the packaging layer; and
a third insulating layer disposed between the packaging layer and the conductive trace layer.

12. The chip device package as claimed in claim 11, wherein the third insulating layer comprises a stress release layer.

13. The chip device package as claimed in claim 1, further comprising:
a first passivation layer covering the conductive trace layer and having an opening to expose the conductive trace layer; and
a conductive bump disposed in the opening of the first passivation layer to electrically connect to the conductive trace layer.

14. The chip device package as claimed in claim 13, wherein the conductive bump comprises a ball grid array (BGA) or a land grid array (LGA).

15. The chip device package as claimed in claim 1, further comprising:
a second passivation layer covering the first surface of the semiconductor substrate; and
an adhesive layer disposed between the semiconductor substrate and the second passivation layer.

16. The chip device package as claimed in claim 15, wherein the second passivation layer has a flat surface and the material of the second passivation layer comprises a wear-resisting material with hardness greater than 7.

17. A method for fabricating a chip package, comprising:
providing a semiconductor wafer, having a first surface and an opposite second surface, wherein the semiconductor wafer contains a plurality of semiconductor components and a plurality of conductive pads disposed on the first surface;
forming a plurality of through holes, extending from the second surface of the semiconductor wafer to the conductive pads;
forming a first insulating layer under the second surface of the semiconductor substrate;
forming an opening in the first insulating;
forming a redistribution layer under the second surface of the semiconductor wafer, electrically connecting to the conductive pads in the through holes, wherein the redistribution layer is conformally formed under the first insulating layer and conformally formed in the opening of the first insulating layer and an edge of the redistribution layer is exposed at a sidewall of the semiconductor wafer; and
forming a conductive trace layer below the redistribution layer, extending to the sidewall of the semiconductor wafer to electrically contact with the redistribution layer.

18. The method as claimed in claim 17, wherein the step of forming the redistribution layer comprises:
forming a first redistribution layer in the through holes to electrically connect to the conductive pads and the first redistribution layer extending to under the second surface of the semiconductor wafer; and;
forming a second redistribution layer below the first redistribution layer and electrically connecting to the first redistribution layer.

19. The method as claimed in claim 18, further comprising:
conformally forming a second insulating layer on the second surface of the semiconductor wafer and on sidewalls of the through holes,
wherein the first insulating layer covers the first redistribution layer and the second insulating layer;
the first redistribution layer is exposed through the opening of the first insulating layer; and
the second redistribution layer is formed in the opening of the first insulating layer to electrically connect to the first redistribution layer and extends onto the first insulating layer.

20. The method as claimed in claim 19, further comprising:
providing a carrier layer to bond with the first surface of the semiconductor wafer;
thinning the semiconductor wafer;
providing a packaging layer to bond with the second surface of the semiconductor wafer;
forming a third insulating layer under the packaging layer; and
forming a plurality of notch channels in the third insulating layer, the packaging layer and the first insulating layer to expose an edge of the second redistribution layer, wherein the notch channels are disposed apart from the first redistribution layer with a distance, and the conductive trace layer is conformally formed in the notch channels and extending onto the third insulating layer.

21. The method as claimed in claim 20, wherein the carrier layer comprises a semiconductor substrate or a glass substrate.

22. The method as claimed in claim 21, further comprising:
forming a first passivation layer covering the conductive trace layer;
forming a plurality of openings in the first passivation layer to expose the conductive trace layer; and
forming a plurality of conductive bumps in the openings of the first passivation layer to electrically connect to the conductive trace layer.

23. The method as claimed in claim 22, further comprising:
removing the carrier layer;
forming a second passivation layer over the first surface of the semiconductor wafer; and
dicing the semiconductor wafer to form a plurality of chip packages.

24. A chip package, comprising:
- a semiconductor substrate, having a first surface and an opposite second surface, containing a semiconductor component and a conductive pad disposed on the first surface;
- a through hole extending from the second surface of the semiconductor substrate to the conductive pad;
- a redistribution layer disposed under the second surface of the semiconductor substrate, electrically connecting to the conductive pad in the through hole, wherein an edge of the redistribution layer is exposed at a sidewall of the semiconductor substrate;
- a conductive trace layer disposed below the redistribution layer, extending to the sidewall of the semiconductor substrate to electrically contact with the redistribution layer;
- a packaging layer disposed under the second surface of the semiconductor substrate and between the redistribution layer and the conductive trace layer;
- an adhesive layer disposed between the redistribution layer and the packaging layer; and
- an insulating layer disposed between the packaging layer and the conductive trace layer.

* * * * *